(12) United States Patent
Rabinovitch et al.

(10) Patent No.: US 9,996,645 B2
(45) Date of Patent: Jun. 12, 2018

(54) METHOD AND APPARATUS FOR MODELING DELAYS IN EMULATION

(71) Applicant: Synopsys, Inc., Mountain View, CA (US)

(72) Inventors: Alexander Rabinovitch, Shrewsbury, MA (US); Cedric Alquier, Wissous (FR); Sebastien Delerse, Wissous (FR)

(73) Assignee: SYNOPSYS, INC., Mountain View, CA (US)

( * ) Notice: Subject to any disclaimer, the term of this patent is extended or adjusted under 35 U.S.C. 154(b) by 75 days.

(21) Appl. No.: 14/679,954

(22) Filed: Apr. 6, 2015

(65) Prior Publication Data

US 2016/0292334 A1  Oct. 6, 2016

(51) Int. Cl.
    *G06F 17/50* (2006.01)
(52) U.S. Cl.
    CPC .................. *G06F 17/5031* (2013.01)
(58) Field of Classification Search
    CPC .............. G06F 17/5031; G06F 15/80
    USPC ........................................... 716/108
    See application file for complete search history.

(56) References Cited

U.S. PATENT DOCUMENTS

| 6,873,187 | B1 * | 3/2005 | Andrews et al. ............... 326/93 |
| 2008/0101522 | A1 * | 5/2008 | Ngo ............... G01R 31/318552 375/372 |
| 2010/0082117 | A1 * | 4/2010 | Korsberg et al. ................. 700/3 |
| 2011/0187433 | A1 * | 8/2011 | Baumann ............... H03K 5/135 327/276 |
| 2015/0121327 | A1 * | 4/2015 | Kamal ..................... G06F 1/10 716/113 |

* cited by examiner

*Primary Examiner* — Suchin Parihar
(74) *Attorney, Agent, or Firm* — Alston & Bird LLP

(57) ABSTRACT

A hardware verification system according to one embodiment includes, in part, a plurality of programmable devices. The plurality of programmable devices include a master scheduler, a plurality of schedulers and a plurality of programmable delay elements. A first one of the plurality of schedulers is configured to receive one or more delay values associated with one or more of the plurality of delay elements. Each of the plurality of programmable delay elements corresponds to a delay. The first scheduler is further configured to send a parameter corresponding to the one or more delay values to the master scheduler, and generate one or more signals corresponding to the one or more delay elements in response to a control signal the first scheduler receives from the master scheduler.

16 Claims, 6 Drawing Sheets

METHOD AND APPARATUS FOR MODELING DELAYS IN EMULATION

TECHNICAL FIELD

The present invention relates generally to testing a circuit design, and more specifically to testing such circuit using a programmable emulation tool.

BACKGROUND

Integrated circuit (IC) designers commonly describe their designs in HDL (hardware description language) such as Verilog, VHDL, SystemC, and the like. In IC design, hardware emulation may refer to the process of replicating the behavior of one or more pieces of hardware (typically a design under test) with another piece of hardware, typically a special-purpose emulation system. An emulation model is usually based on a hardware description language source code, which is compiled into the format used by emulation system. The goal is debugging and functional verification of the system being designed. Overall progress of the emulation is usually controlled by a clock signal generated on the emulator hardware.

There are a number of clock modeling styles in HDL languages that define non-periodic clocks, often with pseudo-random order of edge events between different clock signals. The intent of such generators is to model the behavior of the clock generators that are hardware devices or hardware macros of application specific integrated circuits (ASICs), such as phase locked loops (PLLs). In general, these behavioral generators are not HDL synthesizable code. Those generators usually expose design bugs when crossing different clock domains for designs that have asynchronous clock domains that are derived from independent oscillators. As a result, order of clocking events may not be deterministic in physical hardware for such designs.

The clocking system defined with the above described behavioral code can be distributed in the system, which can cause performance issues. In general, maintaining consistent delays among different FPGAs in an emulation system may be difficult.

SUMMARY

A hardware verification system according to one embodiment includes, in part, a plurality of programmable devices. The plurality of programmable devices include a master scheduler, a plurality of schedulers and a plurality of programmable delay elements. A first one of the plurality of schedulers is configured to receive one or more delay values associated with one or more of the plurality of delay elements. Each of the plurality of programmable delay elements corresponds to a delay. The first scheduler is further configured to send a parameter corresponding to the one or more delay values to the master scheduler, and generate one or more signals corresponding to the one or more delay elements in response to a control signal the first scheduler receives from the master scheduler.

In one example, the master scheduler is configured to generate one or more control signals in each system clock cycle in accordance with a minimum of one or more parameters received from the plurality of schedulers. In one example, the master scheduler is configured to update the control signal if the parameter received from the first scheduler attains a minimum among one or more parameters received from the plurality of schedulers.

In one example, the control signal is a single bit. In another example, the control signal includes more than one bit. In one example, the first scheduler is further configured to generate the parameter by taking a minimum among the one or more delay values.

In one example, the hardware verification system includes a hardware description language (HDL) simulator. The HDL simulator includes a software scheduler which has at least one software delay parameter. The master scheduler is further configured to send a hardware delay parameter to the software scheduler, and receive an acknowledgement from the software scheduler when the hardware delay parameter is reached. In one example, the hardware delay parameter is a minimum among one or more parameters received from the plurality of schedulers.

In one example, at least one of the plurality of programmable delay elements correspond to an always clock generator block.

In one example, a method for mapping a design to a plurality of programmable devices is disclosed. The method includes, in part, selecting a master scheduler and a plurality of schedulers from among the plurality of programmable devices, receiving, by a first one of the plurality of schedulers, a plurality of delay values each associated with a plurality of programmable delay elements. The method further includes, sending a parameter corresponding to the plurality of delay values from the first scheduler to the master scheduler, and generating a plurality of signals corresponding to the plurality of delay elements in response to a control signal the first scheduler receives from the master scheduler.

In one example, an apparatus for verifying a design using a plurality of programmable devices is disclosed. The apparatus includes, in part, means for selecting a master scheduler and a plurality of schedulers from among the plurality of programmable devices. A first one of the plurality of schedulers includes, in part, means for receiving a plurality of delay values each associated with a plurality of programmable delay elements, each programmable delay element corresponding to a delay, means for sending a parameter corresponding to the plurality of delay values to the master scheduler, and means for generating a plurality of signals corresponding to the plurality of delay elements in response to a control signal the first scheduler receives from the master scheduler. In general, any scheduler, disposed in any level of a hierarchy tree, can receive a control signal from master scheduler and/or other higher level schedulers.

A hardware verification system according to one embodiment includes, in part, a plurality of programmable devices and at least one master scheduler. The plurality of programmable devices may include a plurality of schedulers and a plurality of programmable delay elements. In one example, one or more of the plurality of programmable devices may include the at least one master scheduler. In another example, a master scheduler may reside on a stand-alone processor. The plurality of schedulers may be similar to each other or different from each other without departing from the teachings of the present disclosure. At least a first one of the plurality of the programmable devices includes, in part, a first scheduler. The first scheduler causes operation of a scheduled delay to resume in response to receiving a first control signal from master scheduler. At least one master scheduler is configured to generate the first control signal in accordance with at least a first delay parameter. In one example, the master scheduler receives the first delay parameter from the first scheduler. In one embodiment, master scheduler receives one or more delay parameters from intermediate schedulers. In general, any scheduler disposed in any level of the hierarchy tree can send a delay parameter to master scheduler and/or receive its corresponding control signal from master scheduler and/or other higher-level schedulers.

A better understanding of the nature and advantages of the embodiments of the present invention may be gained with reference to the following detailed description and the accompanying drawings.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In one embodiment, a distributed scheduling system is disclosed for a hardware emulation system. The distributed scheduling system may include a master scheduler and one or more schedulers. Each of the schedulers may reside in one of the programmable devices (e.g., field programmable gate arrays (FPGAs)) in the hardware emulation system. The distributed scheduler allows distributed clock generation in the emulation system.

In one embodiment, behavioral procedural blocks are synthesized with delays into state machines that, in turn, request delays to the distributed scheduling service. For example, behavioral register transfer logic (RTL) representation of clock generators are converted to state machines that request delay into the distributed scheduling system. In general, the scheduling service may receive requests from multiple procedural blocks within a circuit.

In one embodiment, the delays and/or clock generators are modeled in the hardware emulation system by a distributed time scheduler. In one embodiment, the delays are placed close to their original location in the original design under test. Utilizing a distributed time scheduler architecture results in major improvements in emulation performance compared to other systems known in the art. For example, some of the current systems force all of the delays to reside in a single FPGA, which is not always possible in terms of scalability, because values of delays can be design variables and not constants.

When emulation with HDL delays is connected to an HDL simulator that is also consuming delays, it is required to synchronize the simulation time and emulation time. In one embodiment, in presence of an HDL simulator interacting with the emulator, an additional level of scheduler may be added in the simulator. Therefore, the top level scheduler may grant delays of the emulator and simulator to synchronize their operation. Alternatively, master scheduler in emulation can maintain the next future delay in simulation and vice versa.

Figure 1:
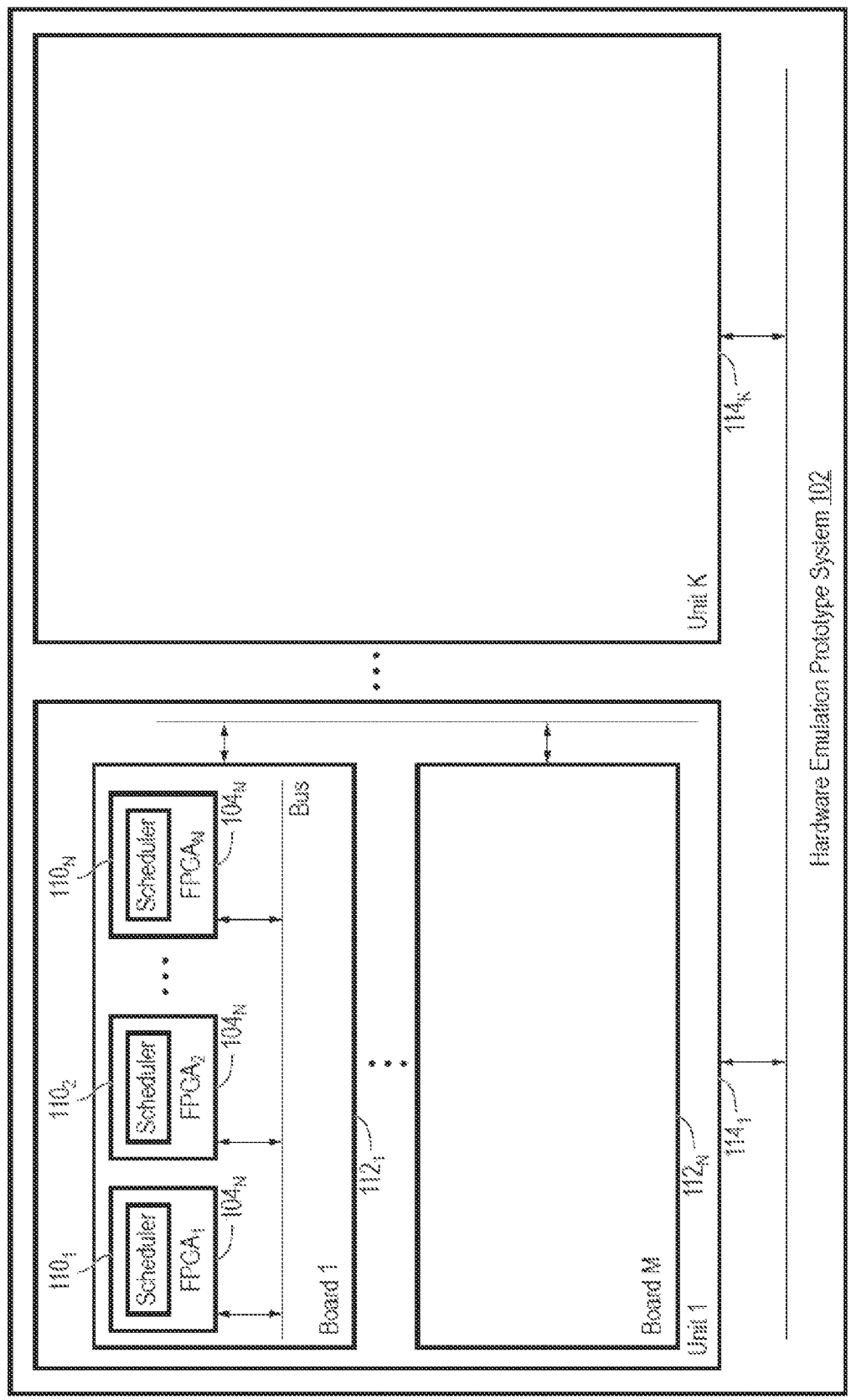
FIG. 1 is an exemplary high level block diagram of a hardware emulation or prototype board, according to one embodiment of the present invention.

FIG. 1 is an exemplary high level block diagram of a hardware emulation or prototype system 102 that can be used to verify, test or debug a circuit design. As illustrated, the hardware emulation/prototype system 102 may include a multitude of programmable processors (e.g., FPGAs $104_1$ through $104_N$), and other blocks (not shown). The hardware emulation/prototype system receives a circuit design, and programs the programmable processors to verify behavior of the circuit design. System 102 may include a primary system clock from which a number of other clock signals can be generated.

The programmable processors $104_1$-$104_N$ can be placed into one or more hardware boards $112_1$ through $112_M$. Multiple of such boards can be placed into a hardware unit (e.g., $114_1$). The boards within a unit may be connected using backplane of the unit or any other types of connections. In addition, multiple hardware units (e.g., $114_1$ through $114_K$) can be connected to each other into a multi-unit system, by cables or any other means. In general, the hardware emulation or prototype system 102 may be made of a single board, a single unit with multiple boards, or multiple units, without departing from the teachings of the present disclosure.

As described herein, each of the programmable processors $104_1$-$104_N$ may include one or more schedulers. For example, as illustrated, $FPGA_1$ $104_1$ includes scheduler $110_1$, $FPGA_2$ $104_2$ includes scheduler $110_2$, and $FPGA_N$ $104_N$ includes scheduler $110_N$. In addition, each board may include a board-level scheduler, and each unit may include a unit-level scheduler. The schedulers may interact with each other to perform distributed scheduling of signals in the emulation system, according to one embodiment.

In one embodiment, an emulation system including a distributed scheduling service is disclosed. The distributed scheduling service may include a master scheduler and one or more other schedulers. The distributed scheduling service within the emulator allows to support procedural delays in the behavioral RTL in a manner that matches the simulation semantic. In one embodiment, a procedural block with delay is transformed into a state machine by the behavioral compiler, where every new delay induces a new state. Every time when original process has "delay," the transformed process will delegate a number equal to the value of "delay" variable to the distributed scheduling service.

In one example, the procedural block may be an "always" block defined in Verilog as follows:

always begin
   delay=a+b;
   #delay c=~c;
end.

In this example, a and b may be variables that are not known in advance, therefore, the value of delay is dependent on instantaneous values of signal a and signal b. After a certain number of cycles (e.g., equal to the delay value) is passed, signal c is toggled. For example, if at a certain point in time, a=3 and b=2, then after delay of 5 units, value of signal c is toggled. It should be noted that delay of 5 unit may take 5 clock cycles or less. In one example, delays of 3, 5 and 10 units are scheduled simultaneously in a design, and no other delays exist in the design. In this example, unique cycles of the emulator may be aligned with unique delays of interest. In this case, there may be only three driver clock cycles that correspond to global times of 3, 5 and 10 respectively (e.g., no cycles done for 4, 6, 7, 8 9). In other words, within current driver clock cycle, the emulator may compute the smallest delays in the future that next logical emulation time is aligned with the next driver clock cycle of the emulator.

Figure 2:
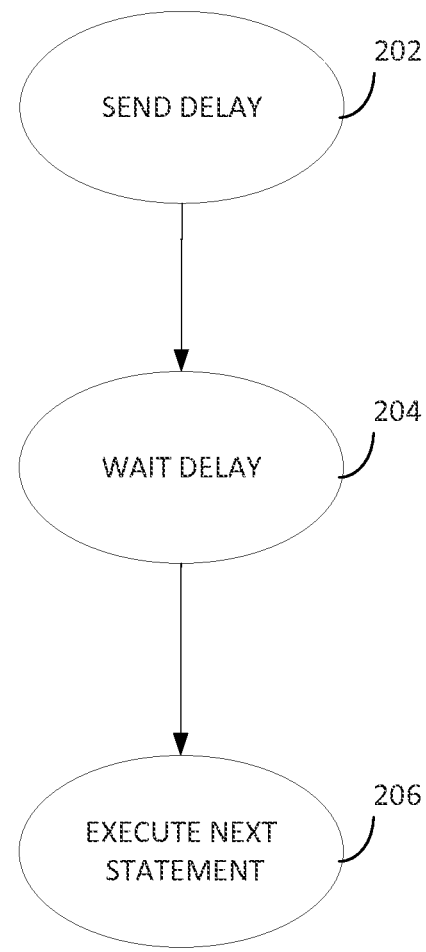
FIG. 2 is an exemplary state machine corresponding to a procedural block transformed by a compiler, according to one embodiment of the present invention.

FIG. 2 is an exemplary state machine corresponding to a procedural block transformed by a compiler, according to one embodiment of the present invention. As illustrated, in block 202, the procedural block may send the delay value to a scheduler block. At 204, the procedural block may wait a certain number of time steps (equal to the delay value). At 206, the procedural block resumes execution and executes the next statement.

In one embodiment, some or all RTL always blocks that schedule delays are transformed into synthesizable state machines. The state machines may satisfy the following characteristic. At the beginning of emulation cycle, each always block generates at most one request for a delay that needs to be scheduled. For example, always block AB1 can request delay #3 and always block AB2 requests #20. In one example, always block AB3 requests no delay if it is in a middle of a delay that is already scheduled, but the delay has not matured yet.

In one embodiment, a minimal delay among time increments requested by multiple processes with delay is computed by one or more of the master scheduler and/or other schedulers. The processes whose time increment request attains the minimum shall be resumed at appropriate state during the next emulation clock cycle.

Figure 3:
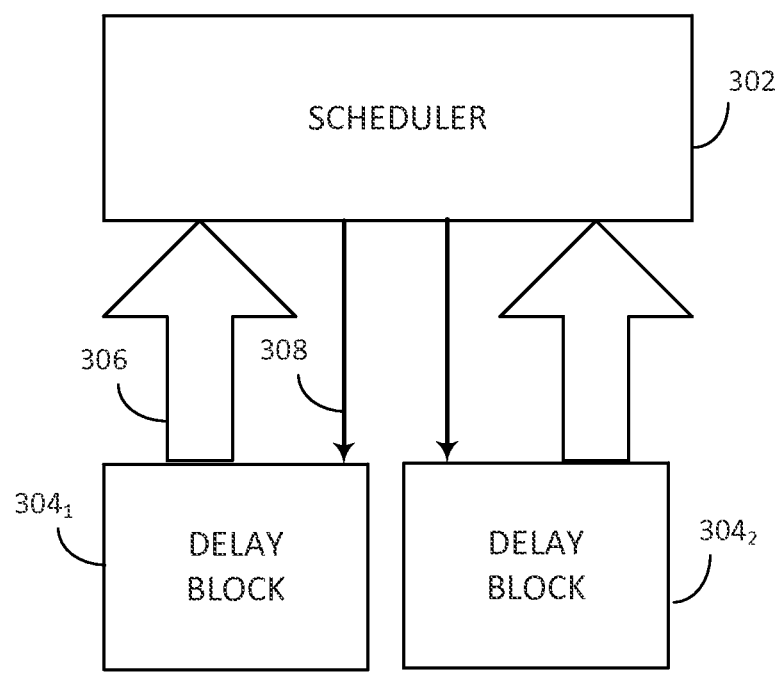
FIG. 3 is an exemplary scheduler, according to one embodiment of the present invention.

FIG. 3 is an exemplary scheduler unit, according to one embodiment of the present invention. In one example, the scheduler unit may compute a minimum among all the delay values that it receives. The scheduler may be a master scheduler and/or any other scheduler inside FPGAs and/or other processors. One or more delay blocks may communicate with the scheduler 302. Each of the delay blocks may send a delay value to the scheduler. For example, the delay block $304_1$ may send a value of 5 and the delay block $304_2$ may send a value of 7 to the scheduler. The scheduler calculates a minimum of the two received numbers. When the minimum number of cycles are passed, the scheduler sends a single bit 308 to the delay block $304_1$ to notify it that the minimum is attained and the block resumes execution. It should be noted that in the present document, minimum calculation is described as a mere example of the scheduling algorithm that is performed by the schedulers. Any other scheduling algorithm may be used by the distributed scheduler without departing from the teachings of the present disclosure.

In one embodiment, a scheduler can be connected to an upper level of schedulers, in order to build an unbalanced hierarchical tree. As described herein, at any level, procedural blocks can be added to the hierarchical tree.

Figure 4:
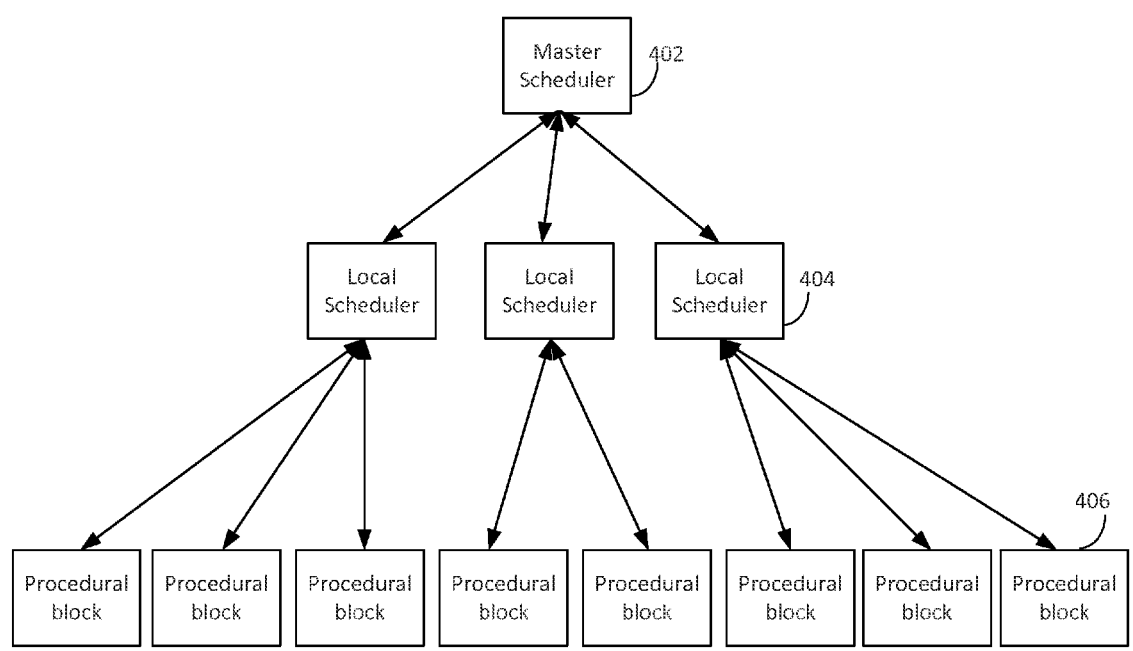
FIG. 4 is an exemplary tree representing a distributed scheduler, according to one embodiment of the present invention.

FIG. 4 is an exemplary tree representing the distributed scheduler, according to one embodiment of the present invention. As illustrated, the distributed scheduler may have a master scheduler 402, and multiple schedulers 404. Each of the schedulers are connected to one or more procedural blocks 406, in addition to master scheduler. It should be noted that a distributed scheduler, may in general, include any number of levels of schedulers disposed in a hierarchy tree. Each level may include one or more schedulers and/or delay elements. A scheduler can receive value of delay from a delay element or from another scheduler. Each scheduler may send a delay parameter to a higher-level scheduler (e.g., intermediate scheduler and/or master scheduler). In addition, each scheduler can receive a control signal from another scheduler (e.g., master scheduler and/or higher level intermediate schedulers). In one example, ultimate minimum is computed by master scheduler. In one embodiment, master scheduler sends control signals to intermediate-level schedulers and intermediate-level schedulers send control signals to the lower-level schedulers.

In order to reduce the communication between different FPGAs in the emulation system, in one embodiment, the tree may be generated by the compiler following the hardware architecture of the system. In one embodiment, the system may have one or more schedulers per FPGA, and one master scheduler per FPGA Board.

Figure 5:
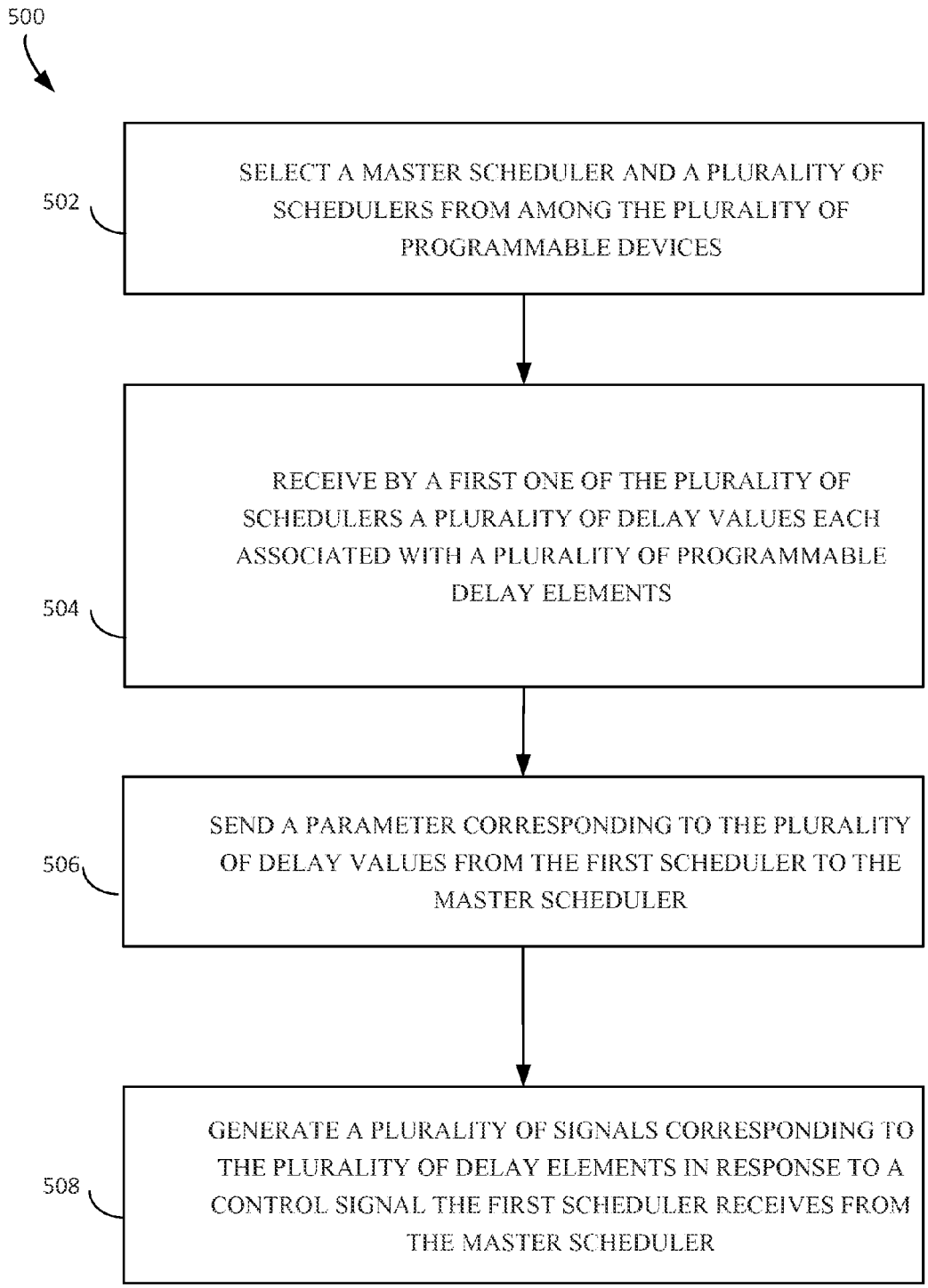
FIG. 5 illustrates an exemplary flow chart for distributed scheduling of a circuit, according to one embodiment of the present invention.

FIG. 5 illustrates an exemplary flow chart for distributed scheduling of a circuit, according to one embodiment of the present invention. At 502, a master scheduler and a plurality of schedulers are selected from among the plurality of programmable devices. In general, a hierarchy of schedulers is used that may or may not be identical in nature. At 504, a first one of the plurality of schedulers receives a plurality of delay values each associated with a plurality of programmable delay elements. Each programmable delay element corresponds to a delay. In one embodiment, the programmable delay element can correspond to a delay expressed in register transfer language or any other language means to define a notion of delaying evaluation of certain statements of processes in time, where the notion of time could correspond to logical time units.

At 506, the first scheduler sends a parameter corresponding to the plurality of delay values to the master scheduler. At 508, the first scheduler generates a plurality of signals corresponding to the plurality of delay elements in response to a plurality of control signals that the first scheduler receives from the master scheduler.

In general, the emulation hardware may be composed of multiple FPGAs and/or of multiple boards having multiple FPGAs. The distributed scheduling system described herein can be used in an emulation system with multiple FPGAs on a single board and/or multiple FPGAs on multiple boards. Multiple procedural blocks with delays can be mapped onto each FPGA, along with one or more schedulers. When multiple procedural blocks request multiple delay values during same system clock cycle, a local minimum among those requests is computed by the scheduler within the FPGA. In one example, only one delay parameter is routed to master scheduler from each of the schedulers. In on example, one of the FPGAs may be considered as Board master FPGA, which includes master scheduler. In general, one or more master schedulers may exist in a scheduling system. In one embodiment, the scheduling hierarchy tree may include one or more master schedulers (disposed in any number of hierarchy levels) and any number of schedulers (e.g., local schedulers, intermediate schedulers) disposed in any number of hierarchy levels between master schedulers and the delay elements. In one embodiment, two of master schedulers may be identical copies of the same scheduler. Having identical master schedulers may result in performing redundant operations. However, it reduces propagation delay of intermediate signals. In another embodiment, each of master schedulers may be different from the other master schedulers. In general, any number of schedulers may be disposed on an emulation board without departing from the teachings of the present disclosure. The emulation board may include any number of programmable processors and/or stand-alone processors.

In one embodiment, each scheduler in an FPGA that has procedural blocks with delay will delegate to the Board master FPGA the minimum delay value among all delay values requested within the FPGA. In one example, master scheduler computes the global minimum within the clock generator module as if these were regular candidate delays of system clock generating algorithm and toggle a primary clock bit for each delay that attains the minimum. More specifically, master scheduler sets the bit to one at the edge of the driver clock and clears the bit back to zero shortly before the end of the driver clock cycle. In one embodiment, there will be at most one special bit maintained by the clock generator module per FPGA. This bit indicates whether any procedural blocks with delay need to be executed within FPGA during current driver clock cycle.

In one embodiment, performance of the emulation system may be defined by the time taken by the following sequence on a single Board system: i) Assignment of the delay values on the input of the scheduler in the FPGA system (e.g., minimum computation unit); ii) Computation of the local minimum; iii) Routing of the FPGA minimums to the Board master FPGA; iv) Computation of the minimum inside the Board master FPGA; and v) Routing of the FPGA bit to the FPGAs that reached the minimum.

For multi-board FPGA systems, any number of intermediate levels of minimum computation and/or schedulers may be added to the system. At the top of the pyramid (e.g., top of the scheduling tree) the Board master FPGA resides, which includes master scheduling unit. At the bottom of the tree, the procedural blocks with delays reside, each of which is connected to the schedulers. The schedulers may have any number of layers (e.g., one or more).

In one embodiment, each of the schedulers is a combinational circuit that is maintained inside each FPGA (e.g., FPGA-level scheduler). The FPGA-level schedulers compute the minimum among all delays that have been requested within a given FPGA (e.g., FPGA_min). In addition, a combinational circuit is maintained in each FPGA board (e.g., board-level schedulers). The board-level schedulers may be implemented in some FPGA or in a special purpose hardware to compute minimum of the minima that are provided by individual FPGAs (e.g., the FPGA_min numbers). The minimum delay across each board may be denoted as board_min.

Moreover, a unit-level scheduler (e.g., a combinational circuit) is maintained inside a unit to compute the minimum of board_min numbers provides by all boards in the unit. The minimum in each unit may be denoted as unit_min. The unit-level scheduler may be implemented in a FPGA or in a special purpose hardware. In addition, a system-level scheduler is maintained at the system level that computes the minimum within the entire system whereas unit_min numbers are the inputs to this circuit. The system-level schedulers may also be combinational circuits implemented in an FPGA or in a special purpose hardware. In general, any number of levels of hierarchy and/or may be included in a system without departing from the teachings of the present disclosure.

One embodiment hierarchically enables relevant subcomponents in the circuit for evaluation in the next cycle. In one example, the schedulers that determine the minimum in the above example, will also provide the following functionality: one bit of information (e.g., unit_bit) is sent by the system to each unit. In one example, if a unit attains a global minimum in the system at the moment, then unit_bit may be set to one. The meaning of this bit is that only in a unit with unit_bit=1, there shall be maturing of scheduled delays and scheduling of new delays in the next cycle. For units that do not attain the global minimum, a corresponding accumulator shall be decremented to represent correctly the remaining delay requested by such unit. It should be noted that in general, the message sent to each unit by the system may include any number of bits without departing from the teachings of the present disclosure. For example, an integer number with 16 or 32 bits may be sent from the system to each of the units. In most scenarios, a message containing a single bit might be enough to be sent to each unit. In addition, one bit of information (e.g., board_bit) is sent by each unit to each board. If a board attains the unit's global minimum at the moment, then board_bit may be set to 1. The meaning of this bit is that only in a board with board_bit=1, there shall be maturing of scheduled delays and scheduling of new delays in the next cycle. For boards that do not attain the unit's minimum, a corresponding accumulator shall be decremented to represent correctly the remaining delay requested by such board.

In the next hierarchy level, one bit of information (e.g., FPGA_bit) is sent by a board to each FPGA. If an FPGA attains the boards' global minimum at the moment, then FPGA_bit may be set to 1. The meaning of this bit is that only in an FPGA with FPGA_bit=1, there shall be maturing of scheduled delays and scheduling of new delays in the next cycle. For FPGA that do not attain the boards' minimum, a corresponding accumulator shall be decremented to represent correctly the remaining delay requested by such FPGA. Finally, the FPGA that has FPGA_bit=1 shall execute during the next cycle always blocks that attained the minimum within the FPGA. In this case, each always block shall resume in its appropriate state. In one embodiment, instances of identically structured schedulers may be included at FPGA level, board level, unit level and/or system level. These schedulers may or may not have same implementations.

In one embodiment, if communication becomes a performance bottleneck, similar procedural blocks and schedulers may be duplicated into multiple FPGAs in order to avoid inter-FPGA communication. In this scenario, every board and/or FPGA will have enough information to autonomously advance the time wheel in unison with other modules without communication between the FPGAs, therefore, the performance is improved.

In one embodiment the distributed scheduling system may disable an always block, so that it does not contribute new delays to the system until re-enabled again. In the meantime, other always blocks can continue to advance in time and contribute new values for the delays.

It should be noted that the techniques presented herein for modeling delays in the emulation system may be used to model any types of delays in the system without departing from the teachings of the present disclosure. For example, the delays that appear in Verilog tasks and initial blocks, as well as their VHDL counterparts may be modeled in the emulation system using the same paradigms as described above.

In one embodiment, the techniques presented herein for distributed scheduling of delays may be used to support asynchronous style of scheduling delays. For example, an asynchronous delay may be defined as "always @(ev) #del a<=b;" where the value of "ev" is changing in the middle of emulation cycle. As a result, request of the delay to be scheduled cannot be aligned with beginning of cycle.

In one embodiment, a higher level scheduler may send a message of any size to an entity in a lower level. For example, a board-level scheduler may send a message to an FPGA that is more than one bit (e.g., 32 bits, 64 bits or any other number of bits). In one example, the message may include any information such as a full time stamp, or the like.

One embodiment allows a user to use RTL blocks with delays on an FPGA-based emulator in order to model clock generation in the system. In addition, methods are described for optimizing the mapping in function of the emulator architecture.

In case of hardware-software co-simulation, some execution models may prefer to couple execution of the two portions of the design (e.g., hardware and software). In one embodiment, a global scheduler may be added in the software that will be the master scheduler of the system. This will allow hardware and software to have synchronized time. In one example, the functioning of the global scheduler may be as follows: First, a procedural block in hardware requests a delay. Local minimum is computed and transferred to the next level minimum computation in the computation tree. When the minimum reaches the highest level of hardware scheduling tree, the hardware minimum is send across hardware/software boundary to the software scheduler. The software scheduler computes the minimum among the delays requested by the software and the minimum delay in the hardware. When hardware requested minimum is reached, global scheduler notifies the hardware scheduler by sending acknowledge through hardware/software boundary. Next, the procedural block requesting the delay will be notified that delay is reached and it is time to proceed execution. It should be noted that a similar paradigm may be applied for time-coupled execution of two different emulation solutions.

The described methodology enables mapping a design into an FPGA-based emulator without manual intervention of the user. The HDL design may contain non-synthesizable clock generators of behavioral test benches, that can be mapped with procedural blocks having delays. It also allows generating a performance system in function of the Board architecture.

As mentioned before, value of a delay can either be a compile time constant or a real net of variable in the design. In one embodiment, for the case when value of the delay is a design variable (e.g. #my_delay), the delay value can be modified directly from the software test bench using DPI language (direct programming interface), or using any other standard that allows driving the value of a variable in emulation from software.

Although the always block is used as an example for illustration of the proposed techniques, the teachings herein can be applied to support delays in any other behavioral RTL constructs without departing from the teachings of the present disclosure. For example, similar teachings may be used to support delays in initial blocks, forever statements and/or delays inside body of tasks. The tasks may in general be any type of tasks that can be mapped onto emulation. As an example, the initial block may be defined as follows:
 initial begin
 #delay a=~b.

In addition, forever statements may be defined as follows:

```
initial begin
  forever begin
    #delay a = ~b;
  end
end
```

It should be noted that the techniques provided herein may be used in emulation, prototyping, hardware acceleration and/or acceleration of simulation without departing from the teachings of the present disclosure. In addition, although calculating a minimum function in the schedulers is described as an example, in general, similar distributed scheduling paradigm can be used to compute any algebraic function that is associative and commutative (e.g., maximum, sum, product, OR, AND, and the like) without departing from the teachings of the present disclosure.

Figure 6:
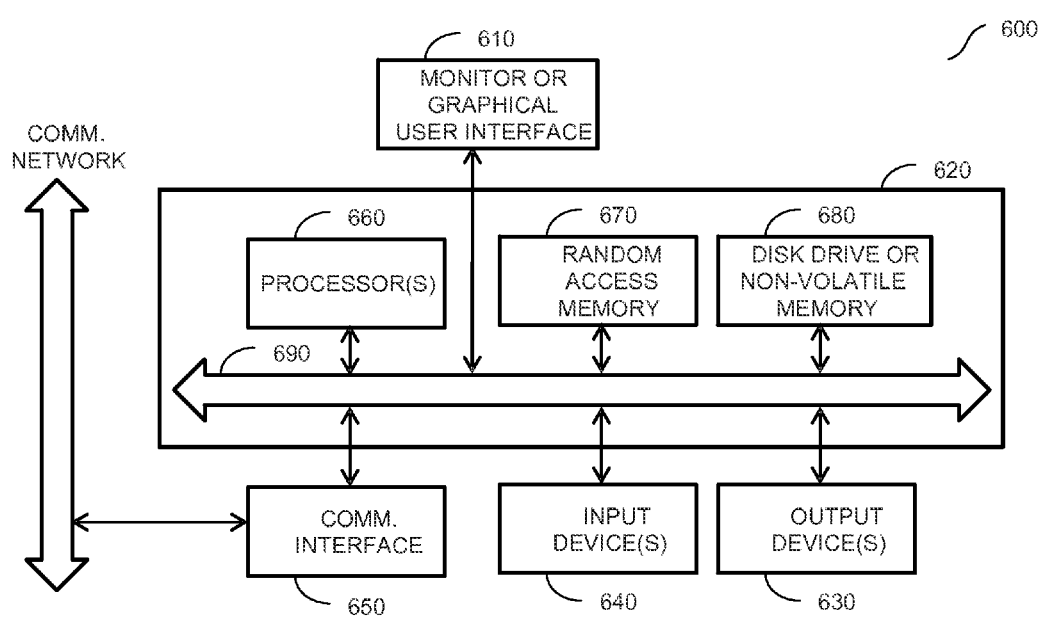
FIG. 6 is an example block diagram of a computer system that may incorporate embodiments of the present invention.

FIG. 6 is an example block diagram of a computer system that may incorporate embodiments of the present invention. FIG. 6 is merely illustrative of an embodiment incorporating the present invention and does not limit the scope of the invention as recited in the claims. One of ordinary skill in the art would recognize other variations, modifications, and alternatives. In one embodiment, computer system 600 typically includes a monitor 610, a computer 620, user output devices 630, user input devices 640, communications interface 650, and the like.

As shown in FIG. 6, computer 620 may include a processor(s) 660 that communicates with a number of peripheral devices via a bus subsystem 690. These peripheral devices may include user output devices 630, user input devices 640, communications interface 650, and a storage subsystem, such as random access memory (RAM) 670 and disk drive 680.

User input devices 630 include all possible types of devices and mechanisms for inputting information to computer system 620. These may include a keyboard, a keypad, a touch screen incorporated into the display, audio input devices such as voice recognition systems, microphones, and other types of input devices. In various embodiments, user input devices 630 are typically embodied as a computer mouse, a trackball, a track pad, a joystick, wireless remote, drawing tablet, voice command system, eye tracking system, and the like. User input devices 630 typically allow a user to select objects, icons, text and the like that appear on the monitor 610 via a command such as a click of a button or the like.

User output devices 640 include all possible types of devices and mechanisms for outputting information from computer 620. These may include a display (e.g., monitor 610), non-visual displays such as audio output devices, etc.

Communications interface 650 provides an interface to other communication networks and devices. Communications interface 650 may serve as an interface for receiving data from and transmitting data to other systems. Embodiments of communications interface 650 typically include an Ethernet card, a modem (telephone, satellite, cable, ISDN), (asynchronous) digital subscriber line (DSL) unit, FireWire interface, USB interface, and the like. For example, communications interface 650 may be coupled to a computer network, to a FireWire bus, or the like. In other embodiments, communications interfaces 650 may be physically integrated on the motherboard of computer 620, and may be a software program, such as soft DSL, or the like.

In various embodiments, computer system 600 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 620 includes one or more Xeon microprocessors from Intel as processor(s) 660. Further, one embodiment, computer 620 includes a UNIX-based operating system.

RAM 670 and disk drive 680 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 670 and disk drive 680 may be configured to store the basic programming and data constructs that provide the functionality of the present invention.

Software code modules and instructions that provide the functionality of the present invention may be stored in RAM 670 and disk drive 680. These software modules may be executed by processor(s) 660. RAM 670 and disk drive 680 may also provide a repository for storing data used in accordance with the present invention.

RAM 670 and disk drive 680 may include a number of memories including a main random access memory (RAM) for storage of instructions and data during program execution and a read only memory (ROM) in which fixed non-transitory instructions are stored. RAM 670 and disk drive 680 may include a file storage subsystem providing persistent (non-volatile) storage for program and data files. RAM 670 and disk drive 680 may also include removable storage systems, such as removable flash memory.

Bus subsystem 690 provides a mechanism for letting the various components and subsystems of computer 620 communicate with each other as intended. Although bus subsystem 690 is shown schematically as a single bus, alternative embodiments of the bus subsystem may utilize multiple busses.

FIG. 6 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. For example, the variable period clock signal may have any number of periods without departing from the teachings of the present disclosure. In addition, similar principles as described corresponding to clock generator and/or schedulers can be applied to other circuit elements. Other modifications and variations will be apparent to those skilled in the art and are intended to fall within the scope of the appended claims.

What is claimed is:

1. A hardware verification system comprising a plurality of programmable devices, said plurality of programmable devices comprising a master scheduler, a plurality of schedulers and a plurality of programmable delay elements, wherein a first one of the plurality of schedulers is configured to:
   receive one or more delay values associated with one or more of the plurality of delay elements, wherein each of the plurality of programmable delay elements corresponds to a delay;
   send a parameter corresponding to the one or more delay values to the master scheduler; and
   generate one or more signals corresponding to the one or more delay elements in response to a control signal the first scheduler receives from the master scheduler.

2. The hardware verification system of claim 1, wherein the master scheduler is configured to:
   generate one or more control signals in each system clock cycle in accordance with a minimum of one or more parameters received from the plurality of schedulers.

3. The hardware verification system of claim 1, wherein the master scheduler is configured to update the control signal if the parameter received from the first scheduler attains a minimum among one or more parameters received from the plurality of schedulers.

4. The hardware verification system of claim 1, wherein the control signal comprises a single bit.

5. The hardware verification system of claim 1, wherein the first scheduler is further configured to:
generate the parameter by taking a minimum among the one or more delay values.

6. The hardware verification system of claim 1, further comprising:
an HDL simulator comprising a software scheduler having at least one software delay parameter,
wherein the master scheduler is further configured to:
send a hardware delay parameter to the software scheduler; and
receive an acknowledgement from the software scheduler when the hardware delay parameter is reached.

7. The hardware verification system of claim 6, wherein the hardware delay parameter is a minimum among one or more parameters received from the plurality of schedulers.

8. The hardware verification system of claim 1, wherein at least one of the plurality of programmable delay elements correspond to an always delay block.

9. A method for mapping a design to a plurality of programmable devices in a hardware verification system, the method comprising:
selecting a master scheduler, a plurality of programmable delay elements, and a plurality of schedulers from among the plurality of programmable devices;
receiving, by a first one of the plurality of schedulers, a plurality of delay values each associated with the plurality of programmable delay elements;
sending a parameter corresponding to the plurality of delay values from the first scheduler to the master scheduler; and
generating, by the first scheduler, a plurality of signals corresponding to the plurality of delay elements in response to a control signal the first scheduler receives from the master scheduler.

10. The method of claim 9, further comprising:
generating, by the master scheduler, one or more control signals in each system clock cycle in accordance with a minimum of one or more parameters received from the plurality of schedulers.

11. The method of claim 9, further comprising:
updating, by the master scheduler, the control signal if the parameter received from the first scheduler attains a minimum among one or more parameters received from the plurality of schedulers.

12. The method of claim 9, wherein the control signal comprises a single bit.

13. The method of claim 9, further comprising:
generating, by the first scheduler, the parameter by taking a minimum among the one or more delay values.

14. The method of claim 9, further comprising:
generating, by a software scheduler in a hardware description language (HDL) simulator, at least one software delay parameter:
sending, by the master scheduler, a hardware delay parameter to the software scheduler; and
receiving, by the master scheduler, an acknowledgement from the software scheduler when the hardware delay parameter is reached.

15. The method of claim 14, wherein the hardware delay parameter is a minimum among one or more parameters received from the plurality of schedulers.

16. The method of claim 9, wherein at least one of the plurality of programmable delay elements correspond to an always clock generator block.

* * * * *